US007113044B2

(12) United States Patent
Wang

(10) Patent No.: US 7,113,044 B2
(45) Date of Patent: Sep. 26, 2006

(54) PRECISION CURRENT MIRROR AND METHOD FOR VOLTAGE TO CURRENT CONVERSION IN LOW VOLTAGE APPLICATIONS

(75) Inventor: Binan Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 216 days.

(21) Appl. No.: 10/920,950

(22) Filed: Aug. 18, 2004

(65) Prior Publication Data

US 2006/0038618 A1 Feb. 23, 2006

(51) Int. Cl.
*H03F 3/04* (2006.01)

(52) U.S. Cl. ....................................... 330/288; 330/292

(58) Field of Classification Search ................ 330/288, 330/292

See application file for complete search history.

(56) References Cited

U.S. PATENT DOCUMENTS 6,028,480 A * 2/2000 Seevinck et al. ........... 330/257

* cited by examiner

*Primary Examiner*—Khanh V. Nguyen
(74) *Attorney, Agent, or Firm*—W. James Brady, III; Frederick J. Telecky, Jr.

(57) ABSTRACT

A voltage-to-current conversion circuit includes an error amplifier (12A) which amplifies a voltage difference between the drains of the first (6) and second (7) transistors of a first current mirror, wherein drain current of the first transistor is proportional to an input voltage (Vin). The output of the error amplifier is connected to the gates of the first and second transistors. A compensation capacitor is coupled between the gate and drain of the first transistor. The drain current of the second transistor flows through a cascode transistor (16) to an input of a second current mirror, an output transistor (31) of which provides a current (Ibias) which is proportional to the input voltage (Vin) as a bias current for the error amplifier, to provide stable operation.

18 Claims, 3 Drawing Sheets

PRECISION CURRENT MIRROR AND METHOD FOR VOLTAGE TO CURRENT CONVERSION IN LOW VOLTAGE APPLICATIONS

BACKGROUND OF THE INVENTION

The present invention relates generally to current mirror circuits, and more particularly to precision current mirror circuitry for use in voltage-to-current conversion applications with low power supply voltages.

FIG. 1 shows a conventional voltage-to-current conversion circuit 1 including a voltage-to-current converter 14 that includes an operational amplifier 2, a resistor 4, an N-channel transistor 3, and a conventional P-channel current mirror including P-channel current mirror transistors 6 and 7. The voltage Vin applied to the (+) input of operational amplifier 2 is reproduced across resistor 4, producing a current Iin that flows through transistors 3 and 6 and is equal to Vin divided by the resistance of resistor 4. The current through transistor 6, scaled by the channel-with-to-channel-length ratio of transistor 7 to that of transistor 6, is produced as Iout through the drain of transistor 7. However, this prior art voltage-to-current converter 1 circuit has a lack of voltage "headroom". That is, if VDD becomes too low (e.g., approximately 1.8 volts for a threshold voltage VT of transistors 6 and 7 of approximately 1.0 volts), transistor 3 begins to "saturate". In this case, the gate-to-source voltage, and hence also the drain-to source voltage, of transistor 6, is approximately 0.8 volts. If, for example, Vin is at approximately 1.0 volts, the source of transistor 3 is also equal to 800 millivolts, so the drain-source voltage of transistor 3 is "squeezed" to nearly 0 volts. Under these conditions transistor 3 therefore has very little voltage "headroom" in which to operate properly. As VDD is further reduced, the amplitude range of Vin becomes even further limited.

FIG. 2 shows a known voltage-to-current converter circuit 10 having increased voltage headroom. Voltage-to-converter circuit 14 is the same in FIG. 2 as in FIG. 1. Conductor 5 in FIG. 2 is not connected to the gates of current mirror transistors 6 and 7 as in FIG. 1, but instead is connected to the (+) input of an error amplifier 12, the output of which is connected by conductor 9 to the gates of current mirror transistors 6 and 7. The (−) input of error amplifier 12 is connected by conductor 8 to the drain of current mirror output transistor 7 and to the source of a P-channel cascode transistor 16. The output current Iout flows through current mirror output transistor 7, cascode transistor 16, and output conductor 17. A bias voltage Vbias is applied to the gate of cascode transistor 16. Vbias can be chosen so that the drain-source voltage of transistor 3 can operate without saturating, whereby voltage-to-current converter circuit 10 can operate with much less voltage headroom than the standard voltage-to-current converter circuit 1 of FIG. 1. Specifically, Vbias is set to equal a VGS (gate-to-source) voltage of transistor 3 plus a few hundred millivolts, so that conductor 8 is a few hundred millivolts below VDD.

Error amplifier 12 in FIG. 2 operates to balance the drain-source voltages of current mirror control transistor 6 and current mirror output transistor 7 and creates the gate voltage on conductor 9 needed to produce the correct amount of current in current mirror transistors 6 and 7. Specifically, error amplifier 12 servos the feedback loop so the voltage of conductor 5 is close to the voltage of conductor 8. Therefore, current mirror transistor 6 takes up only a few hundred millivolts of voltage headroom. This is a large improvement over the approximately 1 volt of voltage headroom required by current mirror transistor 6 in FIG. 1. That leaves plenty of voltage headroom for transistor 3 to operate.

The foregoing circuit resembles a two-stage amplifier including a feedback loop with error amplifier 12 as a first stage and current mirror transistor 6 and voltage-to-current converter 14 as a second stage, wherein a compensation capacitor 50 is coupled between the gate and drain of transistor 6, as proper compensation is required in the feedback loop to provide stable amplifier operation. As the magnitude of the current Iin changes from a very high value to a very low value, the transconductance gm of transistors 6 and 7 also decreases roughly proportionately to Iin, but the transconductance of error amplifier 12 remains relatively constant because its bias current remains constant. (Typically, error amplifier 12 has a fixed tail current and therefore a fixed gm.) As is well known to those skilled in the art, the larger the ratio of the gm of the current mirror (which can be considered to be amplifier stage) to the gm of error amplifier stage 12, the more stable the two-stage amplifier circuit is. Therefore, the circuit shown in FIG. 2 can become unstable for the very low values of Iin. Typically, Vin and Iin can vary by a factor of as much as one or two decades (i.e., 10 to 100). When the current level in current mirror input transistor 6 volts falls to a low enough value, the circuit can become unstable.

FIG. 3 shows a prior art voltage-to-current conversion circuit 20 circuit that provides circuit stability over a wide range of values of Iin. In FIG. 3, transistors 22 and 26 and current sources 24 and 28 constitute a common gate amplifier in which the sources of transistors 22 and 26 receive a differential input signal from conductors 5 and 8. Conductor 9 is a high impedance node that needs to be stabilized by compensation capacitor 50. Since conductor 9 is the only high impedance node in the control loop, it can be stabilized over a wide range of current levels. The currents through current sources 24 and 28 flow through current mirror transistors 6 and 7, respectively. A mismatch in the current sources 24 and 28 causes errors in the current flowing through current mirror output transistor 7. The mismatches between current sources 24 and 28 are due to ordinary semiconductor processing techniques, and reduce the voltage-to-current conversion accuracy of voltage-to-current converter 20, especially at low levels of Iin, wherein a particular mismatch can cause a large percentage error in the ratio between Iin and Iout and hence between Vin and Iout.

Thus, each of the prior art circuits shown in FIGS. 1–3 has particular benefits, but each also has its own shortcomings.

Thus, there is an unmet need for an improved, stable voltage-to-current conversion circuit that provides high precision with low power supply voltage.

There also is an unmet need for an improved, stable voltage-to-current conversion circuit that provides high precision at low power supply voltages and avoids inaccuracies due to mismatches in internal current sources caused by semiconductor processing variations.

There also is an unmet need for an improved, stable voltage-to-current conversion circuit that provides high precision with low supply voltages over a wide range of input voltage values and corresponding internal current levels.

SUMMARY OF THE INVENTION

It is an object of the present invention to provide an improved, stable voltage-to-current conversion circuit that provides high precision with low supply voltage.

It is another object of the invention to provide an improved, stable voltage-to-current conversion circuit that provides high precision at low power supply voltages and avoids inaccuracies due to mismatches in internal current sources caused by semiconductor processing variations.

It is another object of the invention to provide an improved, stable voltage-to-current conversion circuit that provides high precision with low supply voltages over a wide range of input voltage values and corresponding internal current levels.

Briefly described, and in accordance with one embodiment, the present invention provides a current mirror circuit including an error amplifier (12A) amplifying a voltage difference between drains of first (6) and second (7) transistors of a first current mirror, wherein a drain current of the first transistor (6) is provided as an input current (Iin) to the current mirror circuit, an output of the error amplifier coupled to gates of the first (6) and second (7) transistors, a compensation capacitor coupled between the gate and drain of the first transistor (6), a cascode transistor (16) having a source coupled to the drain of the second transistor (7) and a second current mirror having an input receiving a drain current of the cascode transistor (16) and including an output transistor (31) of which provides a current (Ibias) which is proportional to the input current as a bias current for the error amplifier (12A) to provide an output current (Iout) of the current mirror circuit and to provide stable operation thereof.

In accordance with one embodiment, the present invention provides a low voltage voltage-to-current converter circuit which includes an error amplifier (12A) that amplifies a voltage difference between the drains of first (6) and second (7) transistors of a first current mirror, wherein drain current of the first transistor is proportional to an input voltage (Vin) of the voltage-to-current converter circuit. The output of the error amplifier is connected to the gates of the first and second transistors. A compensation capacitor is coupled between the gate and drain of the first transistor. The drain current of the second transistor flows through a cascode transistor (16) to an input of a second current mirror, an output transistor (31) of which provides a current (Ibias) which is proportional to the input voltage (Vin) for use as a bias current of the error amplifier, to provide an output current (Iout) and to provide stable operation.

In one embodiment, a voltage-to-current converter circuit for converting an input voltage (Vin) to an output current (Iout) includes an input voltage-to-input-current converting circuit (14) including an operational amplifier (2) having a first input coupled to receive an input voltage (Vin), an output coupled to a gate of a first transistor (3) having a source coupled to a second input of the operational amplifier and to one terminal of a resistor (4), a second terminal of the resistor (4) being coupled to a first supply voltage conductor (GND) to produce an input current (Iin) through a drain of the first transistor (3). A first current mirror transistor (6) has a drain coupled by a first conductor (5) to the drain of the first transistor (3), the first current mirror transistor (6) having a source coupled to a second supply voltage conductor (VDD) and a gate connected by a second conductor (9) to a gate of a second current mirror transistor (7) having a source coupled to the second supply voltage conductor (VDD). A cascode transistor (16) has a source coupled by a third conductor (8) to a drain of the second current mirror transistor (7) and a gate coupled to a bias voltage (Vbias). An error amplifier (12A) has a first input coupled to the first conductor (5), a second input coupled to the third conductor (8), and an output coupled to the second conductor (9). The error amplifier (12A) also has a bias terminal connected to a fourth conductor (34). A current mirror input transistor (32) has a source coupled to the first supply voltage conductor (GND), and a gate and drain connected by a fifth conductor (35) to a drain of the cascode transistor (16) and to a gate of a first current mirror output transistor (31), the first current mirror output transistor (31) having a source connected to the first supply voltage conductor (GND) and a drain coupled to the fourth conductor (34) to provide to the error amplifier (12A) a bias current (Ibias) that is proportional to the output current (Iout), so as to cause a transconductance of the error amplifier (12A) to vary in the same direction as a transconductance of the first (6) and second (7) current mirror transistors. A second current mirror output transistor (33 or 33A) for conducting the output current (Iout) has a source coupled to one of the first (GND) and second (VDD) supply voltage conductors and also has a gate coupled to one of the second (9) and fifth (35) conductors. The error amplifier (12A) includes first (43) and second (44) input transistors each having a source coupled to a drain of the second current mirror output transistor (31), the first input transistor (43) having a gate coupled to the first conductor (5) and a drain coupled to a drain of a second transistor (45) having a source coupled to the second supply voltage conductor (VDD) and to gates of the second transistor (45) and a third transistor (46) having a source coupled to the second supply voltage conductor (VDD) and a drain coupled to the second conductor (9), the second input transistor (44) having a gate coupled to the third conductor (8) and a drain coupled to the second conductor (9). The first transistor (3), the cascode transistor (16), a current mirror input transistor (32), the first (33) and second (31) current mirror output transistors, and the first (43) and second (44) input transistors are N-channel transistors and the first (6) and second (7) current mirror transistors and the second (45) and third (46) transistors are P-channel transistors. The bias voltage (Vbias) has a value which provides a predetermined amount of voltage headroom for the first (6) and second (7) current mirror transistors.

DETAILED DESCRIPTION OF THE PREFERRED EMBODIMENTS

Figure 1:
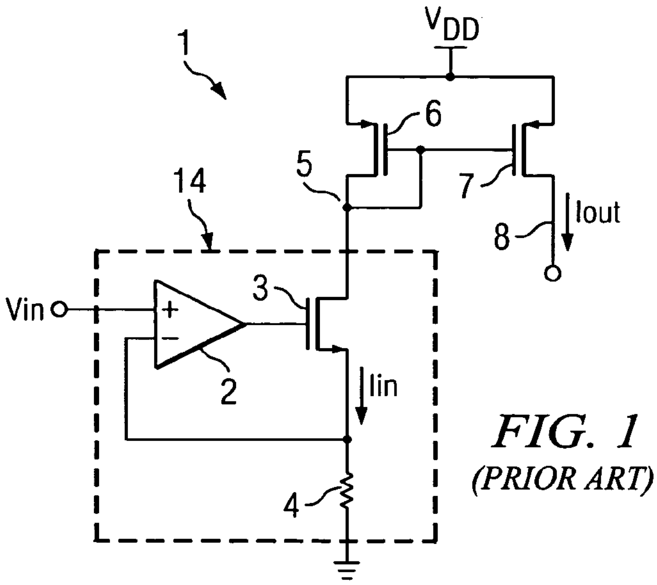
FIG. 1 (PRIOR ART)
FIG. 1 is a is a schematic diagram of a prior art voltage-to-current conversion circuit.
Figure 4:
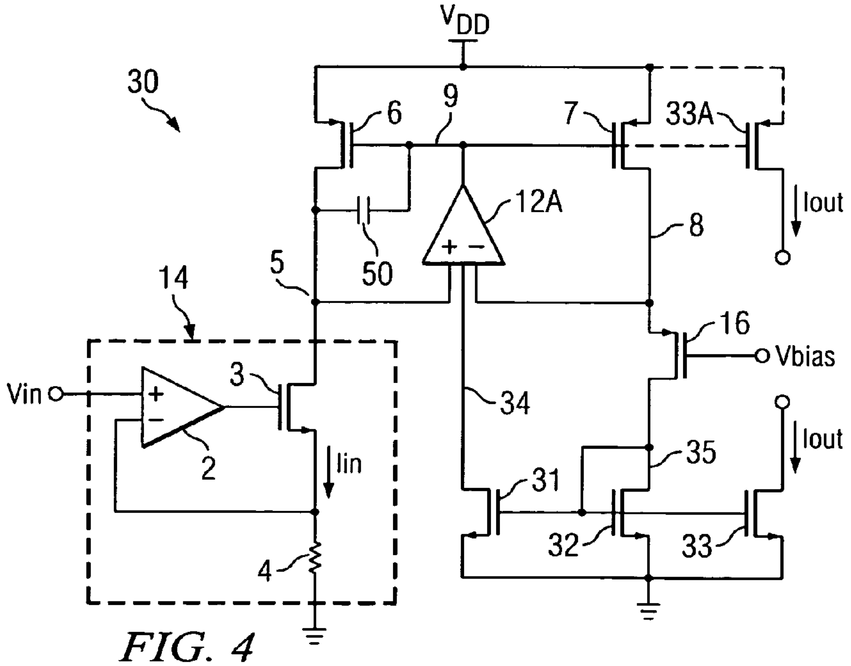
FIG. 4 is a generalized schematic diagram of a voltage-to-current conversion circuit of the present invention.

Referring to FIG. 4, voltage-to-current conversion circuit 30 includes the same voltage-to-current input stage 14 shown in FIG. 1, coupled between ground and conductor 5. Conductor 5 is connected to the drain of P-channel current mirror input transistor 6, one terminal of compensation capacitor 50, and the (+) input of error amplifier 12A. The current Iin (as previously mentioned) flows through current mirror input transistor 6. The (−) input of error amplifier 12A is connected by conductor 8 to the drain of P-channel current mirror output transistor 7 and to the source of P-channel cascode transistor 16. The output of error amplifier 12A is connected by conductor 9 to the gates of current mirror transistors 6 and 7, the sources of which are connected to VDD. The other terminal of compensation capacitor 50 is connected to conductor 9. The gate of cascode transistor 16 is connected to Vbias, and its drain is connected by conductor 35 to the drain of a N-channel current mirror input transistor 32, and also to the gates of current mirror input transistor 32 and two N-channel current mirror output transistors 31 and 33. The sources of current mirror transistors 31, 32 and 33 are connected to ground. The drain of transistor 31 provides a bias current to error amplifier 12A. The output current Iout flows through the drain of transistor 33.

In FIG. 4, the portion of voltage-to-current conversion circuit 30 other than voltage-to-current converter 14 constitutes a current mirror circuit in which the input current is Iin.

Figure 5:
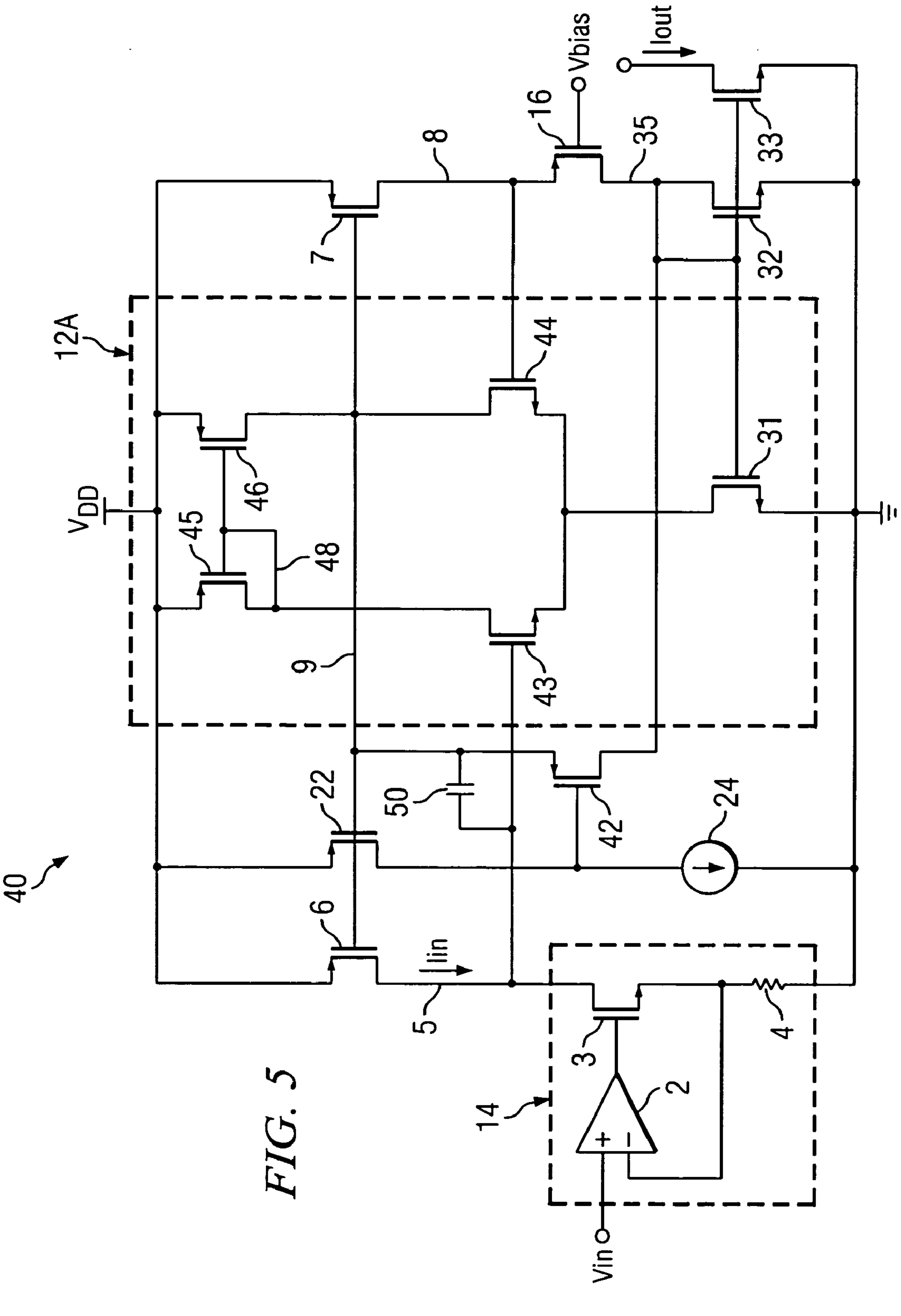
FIG. 5 is a detailed schematic diagram of an implementation of the voltage-to-current conversion circuit of FIG. 4.

FIG. 5 shows a more detailed implementation 40 of voltage-to-current conversion circuit 30 of FIG. 4. In FIG. 5, error amplifier 12A includes a pair of N-channel input transistors 43 and 44, the sources of which are connected to the drain of current mirror output transistor 31, which is illustrated as being also included an error amplifier 12A. Transistor 31 the supplies a bias current Ibias has a tale current to input transistors 43 and 44 of error amplifier 12A. The gate of input transistor 43 is connected to conductor 5, and the gate of input transistor 44 is connected to conductor 8. The drain of error amplifier input transistor 43 is connected by conductor 48 to the drain of P-channel current mirror input transistor 45 and to the gates of transistor 45 and P-channel current mirror output transistor 46. The drain of error amplifier input transistor 44 is connected by conductor 9 to the drain of transistor 46 and to the gates of transistors 6, 7, and 22. Transistor 22 is a P-channel transistor having its source connected to VDD and its drain connected to the gate of a P-channel transistor 42 and to one terminal of a current source 24 having its other terminal connected to ground. The source of transistor 42 is connected to conductor 9, and the drain of transistor 42 is connected by conductor 35 to the drain of cascode transistor 16 and the drain and gate of current mirror input transistor 32.

Transistors 22 and 42 and current source 24 constitute a start-up circuit which prevents error amplifier 12A from locking up in an inoperative condition during initial power-up operation. The circuit including transistors 22 and 42 and current source 24 functions during circuit start-up operation, to prevent a lock-up in which no current flows, which can happen in any self-biased circuit. In FIG. 5, current source 24 provides a low current that pulls down the gate of transistor 42, thereby diverting current into transistor 32, thereby causing at least an initial bias current to flow through transistor 31 and at least one of input transistors 43 and 44 of error amplifier 12A. As soon as error amplifier 12A begins to function, the feedback loop operates to force the proper currents to flow in transistors 43 and 44. Once the proper currents are flowing in transistors 43 and 44, the voltage on the gate of transistor 42 rises to a high voltage and therefore turns transistor 42 off to allow normal operation of the rest of the circuitry.

Figure 2:
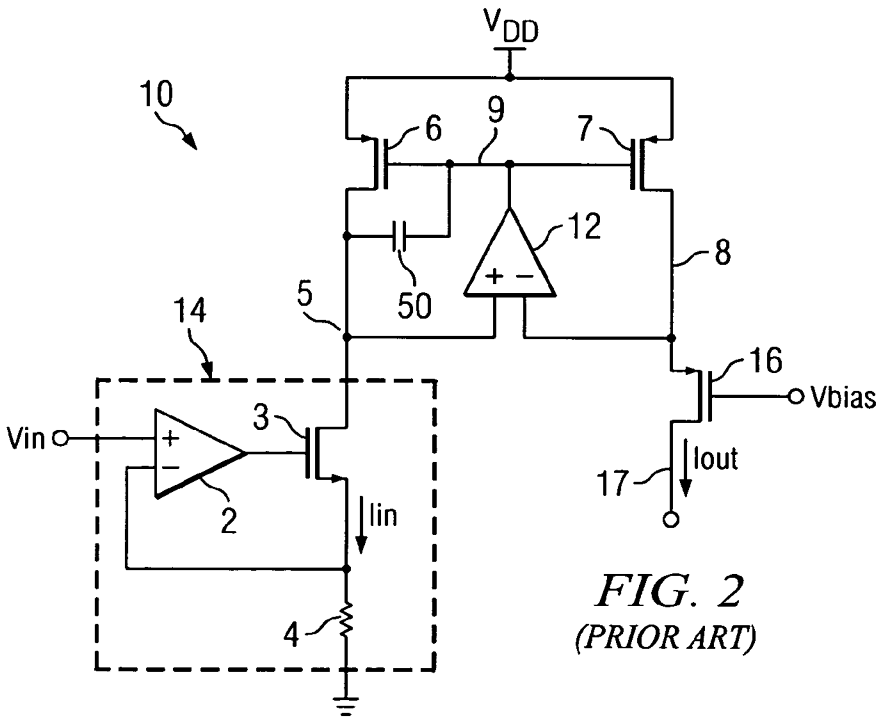
FIG. 2 (PRIOR ART)
FIG. 2 is a schematic diagram of a prior art voltage-to-current conversion circuit for use in low power supply applications.
Figure 3:
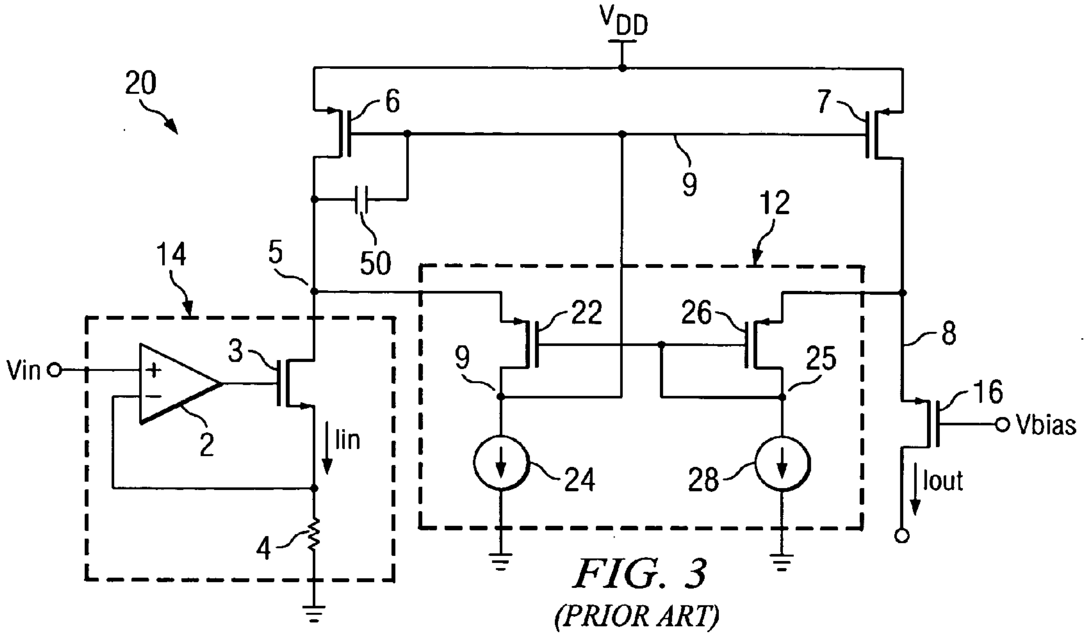
FIG. 3 (PRIOR ART)
FIG. 3 is a schematic diagram of another prior art voltage-to-current conversion circuit.

Voltage-to-current converter circuit 30 of FIG. 4 and voltage-to-current converter 40 of FIG. 5 is similar in some respects to voltage-to-current converter circuit 10 of FIG. 2. Voltage-to-current converter circuits 30 and 40 operate by sensing a voltage and using voltage feedback rather than current feedback as in the circuit of FIG. 2. This avoids the current offset problem and resulting conversion inaccuracy of the circuit of FIG. 3. Most important, the error amplifier bias current Ibias through transistor 31 in FIGS. 4 and 5, and hence the gm of the input transistors of error amplifier 12A, vary with Iout (and also with Iin, since both Iin and Iout are proportional to Vout), which is the same way the gm of current mirror transistors 6 and 7 tracks with Iin and Iout.

Voltage-to-current conversion circuits 30 and 40 of the invention as shown in FIGS. 4 and 5, respectively, utilize a dynamic or self-biasing scheme to maintain feedback loop stability, wherein the bias current for the error amplifier 12A is proportional to the output current Iout, and preferably is substantially less than Iout. Therefore, the bias current, i.e., tail current, in error amplifier 12A tracks Iout, so the transconductance of the current mirror transistors 6 and 7 and the transconductance of error amplifier 12A both vary in the same direction with respect to Iout. This results in excellent feedback loop stability over a wide range of values of Iout (and also of Vout and Iin). Also, a high level of accuracy is achieved, because there are no significant current source mismatches as in the prior art circuit of FIG. 3.

If an output current equal to the magnitude of Iout is desired to be sourced from VDD rather than sunk into ground through transistor 33, a P-channel output transistor 33A can be provided having its gate connected to conductor 9 and its source connected to VDD, as shown in FIG. 5. Then an output current having the same or proportional magnitude as Iout of transistor 33 will flow through the drain of P-channel output transistor 33A.

The above mentioned benefits of excellent stability and accuracy of conversion for the illustrated voltage-to-current conversion circuits 30 and 40 for low voltage applications over a wide range from very low values to high values of the current Iin are equally applicable to the current mirror circuit that remains if the voltage-to-current converter 14 is omitted and Iin is provided as the input to that current mirror circuit.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A current mirror circuit comprising:

(a) an error amplifier amplifying a voltage difference between drains of first and second transistors of a first current mirror, wherein a drain current of the first transistor is provided as an input current to the current mirror circuit;

(b) an output of the error amplifier coupled to gates of the first and second transistors;

(c) a compensation capacitor coupled between a gate and drain of the first transistor;

(d) a cascode transistor having a source coupled to a drain of the second transistor; and (e) a second current mirror having an input receiving a drain current of the cascode transistor and including an output transistor which provides a current that is proportional to the input current as a bias current for the error amplifier to provide an output current of the current mirror circuit and to provide stable operation thereof.

2. A voltage-to-current converter circuit comprising:

(a) an error amplifier amplifying a voltage difference between drains of first and second transistors of a first current mirror, wherein drain current of the first transistor is proportional to an input voltage of the voltage-to-current converter circuit;

(b) an output of the error amplifier coupled to gates of the first and second transistors;

(c) a compensation capacitor coupled between a gate and drain of the first transistor;

(d) a cascode transistor having a source coupled to a drain of the second transistor; and (e) a second current mirror having an input receiving a drain current of the cascode transistor and including an output transistor which provides a current that is proportional to the input voltage as a bias current for the error amplifier to provide stable operation of the voltage-to-current converter circuit.

3. A current mirror circuit for converting an input current in a first conductor to an output current, comprising:

(a) a first current mirror transistor having a drain in which the input current is provided, the first current mirror transistor having a source coupled to a first supply voltage conductor and a gate connected by a second conductor to a gate of a second current mirror transistor having a source coupled to the first supply voltage conductor;

(b) a cascode transistor having a source coupled by a third conductor to a drain of the second current mirror transistor and a gate coupled to a bias voltage;

(c) an error amplifier having a first input coupled to the first conductor, a second input coupled to the third conductor, and an output coupled to the second conductor, the error amplifier also having a bias terminal connected to a fourth conductor;

(d) a current mirror input transistor having a source coupled to a second supply voltage conductor, and a gate and drain connected by a fifth conductor to a drain of the cascode transistor and to a gate of a first current mirror output transistor, the first current mirror output transistor having a source connected to the second supply voltage conductor and a drain coupled to the fourth conductor to provide to the error amplifier a bias current proportional to the output current to cause a transconductance of the error amplifier to vary in the same direction as a transconductance of the first and second current mirror transistors; and (e) a second current mirror output transistor for conducting the output current, the second current mirror output transistor having a source coupled to one of the first and second supply voltage conductors and also having a gate coupled to one of the second and fifth conductors.

4. A voltage-to-current conversion circuit for converting an input voltage to an output current, comprising:

(a) an input voltage-to-input-current converter including an operational amplifier having a first input coupled to receive an input voltage, an output coupled to a gate of a first transistor having a source coupled to a second input of the operational amplifier and to a first terminal of a resistor, a second terminal of the resistor being coupled to a first supply voltage conductor to produce an input current through a drain of the first transistor;

(b) a first current mirror transistor having a drain coupled by a first conductor to the drain of the first transistor, the first current mirror transistor having a source coupled to a second supply voltage conductor and a gate connected by a second conductor to a gate of a second current mirror transistor having a source coupled to the second supply voltage conductor;

(c) a cascode transistor having a source coupled by a third conductor to a drain of the second current mirror transistor and a gate coupled to a bias voltage;

(d) an error amplifier having a first input coupled to the first conductor, a second input coupled to the third conductor, and an output coupled to the second conductor, the error amplifier also having a bias terminal connected to a fourth conductor;

(e) a current mirror input transistor having a source coupled to the first supply voltage conductor, and a gate and drain connected by a fifth conductor to a drain of the cascode transistor and to a gate of a first current mirror output transistor, the first current mirror output transistor having a source connected to the first supply voltage conductor and a drain coupled to the fourth conductor to provide to the error amplifier a bias current proportional to the output current to cause a transconductance of the error amplifier to vary in the same direction as a transconductance of the first and second current mirror transistors; and (f) a second current mirror output transistor for conducting the output current, the second current mirror output transistor having a source coupled to one of the first and second supply voltage conductors and also having a gate coupled to one of the second and fifth conductors.

5. A voltage-to-current conversion circuit for converting an input voltage to an output current, comprising:

(a) an input voltage-to-input-current converter including an operational amplifier having a first input coupled to receive an input voltage, an output coupled to a gate of a first transistor having a source coupled to a second input of the operational amplifier and to a first terminal of a resistor, a second terminal of the resistor being coupled to a first supply voltage conductor to produce an input current through a drain of the first transistor;

(b) a first current mirror transistor having a drain coupled by a first conductor to the drain of the first transistor, the first current mirror transistor having a source coupled to a second supply voltage conductor and a gate connected by a second conductor to a gate of a second current mirror transistor having a source coupled to the second supply voltage conductor;

(c) a cascode transistor having a source coupled by a third conductor to a drain of the second current mirror transistor and a gate coupled to a bias voltage;

(d) an error amplifier having a first input coupled to the first conductor, a second input coupled to the third conductor, and an output coupled to the second conductor, the error amplifier also having a bias terminal connected to a fourth conductor; and (e) a current mirror input transistor having a source coupled to the first supply voltage conductor, and a gate and drain connected by a fifth conductor to a drain of the cascode transistor and to gates of a first current mirror output transistor and a second current mirror output transistor, the first and second current mirror output transistors each having a source connected to the first supply voltage conductor, the first current mirror output transistor having a drain coupled to supply the output current, the second current mirror output transistor having a drain coupled to the fourth conductor to provide to the error amplifier a bias current proportional to the output current to cause a transconductance of the error amplifier to vary in the same direction as a transconductance of the first and second current mirror transistors.

6. The voltage-to-current conversion circuit of claim 5 wherein the first transistor, the current mirror input transistor, and the first and second current mirror output transistors are N-channel transistors and the first and second current mirror transistors and the cascode transistor are P-channel transistors.

7. The voltage-to-current conversion circuit of claim 5 wherein the error amplifier includes the second current mirror output transistor.

8. The voltage-to-current conversion circuit of claim 7 wherein the error amplifier includes first and second input transistors each having a source coupled to a drain of the second current mirror output transistor, the first input transistor having a gate coupled to the first conductor and a drain coupled to a drain of a second transistor having a source coupled to the second supply voltage conductor and to gates of the second transistor and a third transistor having a source coupled to the second supply voltage conductor and a drain coupled to the second conductor, the second input transistor having a gate coupled to the third conductor and a drain coupled to the second conductor.

9. The voltage-to-current conversion circuit of claim 5 including a compensation capacitor coupled between the first and second conductors.

10. The voltage-to-current conversion circuit of claim 8 wherein the first transistor, the current mirror input transistor, the first and second current mirror output transistors, and the first and second input transistors are N-channel transistors and the first and second current mirror transistors, the cascode transistor, and the second and third transistors are P-channel transistors.

11. The voltage-to-current conversion circuit of claim 5 wherein the bias voltage has a value which provides a predetermined amount of voltage headroom for the first and second current mirror transistors.

12. The voltage-to-current conversion circuit of claim 8 including a start-up circuit, the start-up circuit including a fourth transistor having a source coupled to the second supply voltage conductor, a gate coupled to the second conductor, and a drain coupled to one terminal of a current source and to a gate of a fifth transistor having a source coupled to the second conductor and a drain coupled to the fifth conductor.

13. A method of operating a current mirror circuit, comprising:

(a) amplifying a voltage difference between drains of first and second transistors of a first current mirror by means of an error amplifier, wherein a drain current of the first transistor is provided as an input current for the current mirror circuit;

(b) applying the amplified voltage difference to gates of the first and second transistors;

(c) providing compensation capacitance between the gate and drain of the first transistor;

(d) setting a drain voltage of the second transistor by means of a cascode transistor; and (e) forcing a drain current of the cascode transistor into an input of a second current mirror including an output transistor which provides a current proportional to the input current as a bias current for the error amplifier to provide an output current of the current mirror circuit and to provide stable operation thereof.

14. A method of operating a voltage-to-current converter, comprising:

(a) amplifying a voltage difference between drains of first and second transistors of a first current mirror by means of an error amplifier, wherein drain current of the first transistor is proportional to an input voltage of the voltage-to-current converter;

(b) applying the amplified voltage difference to gates of the first and second transistors;

(c) providing compensation capacitance between the gate and drain of the first transistor;

(d) setting a drain voltage of the second transistor by means of a cascode transistor; and (e) forcing a drain current of the cascode transistor into an input of a second current mirror including an output transistor which provides a current proportional to the input voltage as a bias current for the error amplifier to provide an output current of the voltage-to-current conversion circuit and to provide stable operation thereof.

15. The method of claim 14 including providing first and second input transistors each having a source coupled to a drain of the second current mirror output transistor as input transistors of the error amplifier, the first input transistor having a gate coupled to a first conductor and a drain coupled to a drain of a second transistor having a source coupled to a first supply voltage conductor and to gates of the second transistor and a third transistor having a source coupled to the second supply voltage conductor and a drain coupled to a second conductor, the second input transistor having a gate coupled to the third conductor and a drain coupled to the second conductor, and providing the bias current as a tail current for the error amplifier.

16. The method of claim 15 including biasing a gate of the cascode transistor so as to provide a predetermined amount of voltage headroom for a circuit producing the drain current of the first transistor proportionally to the input voltage.

17. A current mirror circuit, comprising:

(a) means for amplifying a voltage difference between drains of first and second transistors of a first current mirror by means of an error amplifier, wherein a drain current of the first transistor is provided as an input current for the current mirror circuit;

(b) means for applying the amplified voltage difference to gates of the first and second transistors;

(c) means for providing compensation capacitance between the gate and drain of the first transistor;

(d) means for setting a drain voltage of the second transistor; and (e) means for forcing a drain current of the setting means into an input of a second current mirror including an output transistor which provides a current proportional to the input current as a bias current for the error amplifier to provide an output current of the current mirror circuit and to provide stable operation thereof.

18. A voltage-to-current converter comprising:

(a) means for amplifying a voltage difference between drains of first and second transistors of a first current mirror by means of an error amplifier, wherein drain current of the first transistor is proportional to an input voltage of the voltage-to-current converter;

(b) means for applying the amplified voltage difference to gates of the first and second transistors;

(c) means for providing compensation capacitance between the gate and drain of the first transistor;

(d) means for setting a drain voltage of the second transistor; and (e) means for forcing a drain current of the setting means into an input of a second current mirror including an output transistor which provides a current proportional to the input voltage as a bias current for the error amplifier to provide an output current and to provide stable operation of the voltage-to-current conversion circuit.

* * * * *